(12) United States Patent
Quick

(10) Patent No.: US 8,679,914 B2
(45) Date of Patent: Mar. 25, 2014

(54) METHOD OF FORMING A CHALCOGENIDE MATERIAL AND METHODS OF FORMING A RESISTIVE RANDOM ACCESS MEMORY DEVICE INCLUDING A CHALCOGENIDE MATERIAL

(75) Inventor: Timothy A. Quick, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 86 days.

(21) Appl. No.: 12/917,930

(22) Filed: Nov. 2, 2010

(65) Prior Publication Data

US 2012/0104347 A1    May 3, 2012

(51) Int. Cl.
- *H01L 21/336* (2006.01)
- *H01L 21/00* (2006.01)
- *H01L 21/425* (2006.01)

(52) U.S. Cl.
USPC ....... 438/257; 438/95; 438/515; 257/E31.029

(58) Field of Classification Search
USPC .................................................. 438/95, 257
See application file for complete search history.

(56) References Cited

U.S. PATENT DOCUMENTS

| | | | |
|---|---|---|---|
| 7,115,511 B2 | 10/2006 | Hautala | |
| 7,397,689 B2 | 7/2008 | Liu et al. | |
| 7,670,964 B2 | 3/2010 | Lane | |
| 2002/0015803 A1* | 2/2002 | Akizuki et al. | 427/585 |
| 2006/0151771 A1* | 7/2006 | Asano et al. | 257/2 |
| 2007/0070681 A1* | 3/2007 | Rohr | 365/148 |
| 2007/0295597 A1 | 12/2007 | Ufert | |
| 2008/0023885 A1* | 1/2008 | Anoikin | 264/446 |
| 2008/0099827 A1 | 5/2008 | Kreupl | |
| 2008/0217670 A1 | 9/2008 | Dahmani | |
| 2009/0159558 A1 | 6/2009 | Cholet | |
| 2010/0000607 A1* | 1/2010 | Hanley et al. | 136/265 |
| 2010/0123117 A1 | 5/2010 | Sun et al. | |
| 2010/0243919 A1* | 9/2010 | Hautala et al. | 250/492.3 |

* cited by examiner

*Primary Examiner* — Scott B Geyer
*Assistant Examiner* — Calvin Choi
(74) *Attorney, Agent, or Firm* — TraskBritt

(57) ABSTRACT

A method of forming a chalcogenide material on a surface of a substrate comprising exposing a surface of a substrate to ionized gas clusters from a source gas, the ionized gas clusters comprising at least one chalcogen and at least one electropositive element. A method of forming a resistive random access memory device is also disclosed. The method comprises forming a plurality of memory cells wherein each cell of the plurality of memory cells is formed by forming a metal on a first electrode, forming a chalcogenide material on the metal by a gas cluster ion beam process, and forming a second electrode on the chalcogenide material. A method of forming another resistive random access memory device and a random access memory device including the chalcogenide material are also disclosed.

22 Claims, 8 Drawing Sheets

METHOD OF FORMING A CHALCOGENIDE MATERIAL AND METHODS OF FORMING A RESISTIVE RANDOM ACCESS MEMORY DEVICE INCLUDING A CHALCOGENIDE MATERIAL

TECHNICAL FIELD

Embodiments of the present invention relate to methods of forming chalcogenide materials, and devices including such chalcogenide materials. More specifically, the present invention, in various embodiments, relates to methods of forming chalcogenide materials using a gas cluster ion beam (GCIB) process, methods of forming memory devices including chalcogenide materials, and resulting memory devices.

BACKGROUND

As conventional memory cell structures approach scaling limits, other memory cell structures, such as resistive random access memory (RRAM) cells may enable increased miniaturization of electronic devices. Because of the simplicity of the RRAM cell, the RRAM cells may be used to make smaller devices having non-volatile memory characteristics and an inherently stable memory state.

Generally, an RRAM memory cell may include a variable resistor sandwiched between a first electrode and a second electrode. The variable resistor may be formed of a metal-doped glass material. When an electric field is applied to the metal-doped glass material, the metal ions diffuse within the glass to form a conductive bridge or a low resistance state. An electric field of opposite polarity may then be used to reset the cell to its original high resistance state by disbanding the conductive bridge.

Conventionally, to form the metal-doped glass material of the variable resistor, the glass material, such as a chalcogenide material, may be deposited followed by deposition of the metal material. The glass material and the metal material are subjected to a photo or thermal activation anneal to infuse the metal material into the glass material. However, such activation processes may damage components of the memory device previously formed, as well as increase the time required for forming the RRAM memory cell.

Silver-doped germanium sulfide is one example of a metal-doped glass material used in RRAM memory cells. The germanium sulfide can be deposited, for example, by physical vapor deposition (PVD), evaporation, or high temperature chemical vapor deposition, which are suitable methods for blanket deposition of the material. However, these methods do not enable the deposition of germanium sulfide in small openings. The silver can then be deposited by PVD or evaporation. The germanium sulfide and silver materials can then be subjected to photoactivation or thermal anneal, which can result in infusion of these materials.

Accordingly, additional methods of forming a variable resistor formed of a metal-doped chalcogenide material for use in a RRAM memory cell are needed.

DETAILED DESCRIPTION

Figure 1:
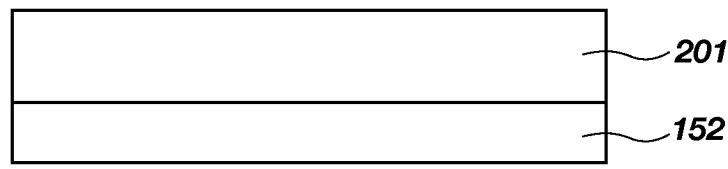
FIG. 1 is a cross-sectional view of a chalcogenide material formed on a substrate.

A doped chalcogenide material, a resistive random access memory (RRAM) device including such a doped chalcogenide material, and methods of forming such a doped chalcogenide material and devices are disclosed. In some embodiments, the doped chalcogenide material is a metal-doped chalcogenide material. The chalcogenide material may be formed using a gas cluster ion beam (GCIB) process and doped in situ with the metal. By forming the doped chalcogenide material using a GCIB process, the doped chalcogenide material may be formed at relatively low (e.g., substantially ambient) temperatures and be substantially free of defects and contaminants. The doped chalcogenide material may be used to form an active region of the RRAM device and function as a switching element thereof.

The following description provides specific details, such as material types, material thicknesses, and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional fabrication techniques employed in the industry. Only those process acts and structures necessary to understand the embodiments of the present disclosure are described in detail below.

In the following detailed description, reference is made to the accompanying drawings, which form a part hereof, and in which is shown, by way of illustration, specific embodiments in which the invention may be practiced. These embodiments are described in sufficient detail to enable a person of ordinary skill in the art to practice the invention. However, other embodiments may be utilized, and structural, logical, and electrical changes may be made without departing from the scope of the invention. The illustrations presented herein are not meant to be actual views of any particular chalcogenide material, RRAM device, semiconductor device, or system, but are merely idealized representations that are employed to describe embodiments of the present disclosure. The drawings presented herein are not necessarily drawn to scale.

Additionally, elements common between drawings may retain the same numerical designation.

The chalcogen of the chalcogenide material may be oxygen (O), sulfur (S), selenium (Se), tellurium (Te), or polonium (Po). In one embodiment, the chalcogen is S. The electropositive element of the chalcogenide material may include, but is not limited to, nitrogen (N), silicon (Si), nickel (Ni), gallium (Ga), germanium (Ge), arsenic (As), silver (Ag), indium (In), cadmium (Cd), zinc (Zn), tin (Sn), antimony (Sb), gold (Au), lead (Pb), bismuth (Bi), or combinations thereof. In one embodiment, the electropositive element is Ge. The chalcogenide material may be a binary, ternary, or quaternary alloy of these elements. While specific examples herein describe the chalcogenide material as germanium sulfide ($GeS_2$), the chalcogenide material may be other chalcogenide materials formed from combinations of the other elements described above.

GCIB processors are known in the art and described in detail in, for example, U.S. Pat. No. 7,115,511, which issued Oct. 3, 2006 and is entitled "GCIB Processing of Integrated Circuit Interconnect Structures," and U.S. Pat. No. 7,670,964, which issued Mar. 2, 2010 and is entitled "Apparatus and Method of Forming a Gas Cluster Ion Beam Using a Low-Pressure Source." Briefly, a condensable, pressurized source gas may be ejected into a substantially lower pressure vacuum through a nozzle producing supersonic gas jet. Expansion of the gas in the lower pressure vacuum causes the gas to cool and a portion of the supersonic gas jet condenses into clusters, each including from several weakly bound atoms or molecules to several thousand weakly bound atoms or molecules. The clusters are then ionized and scanned onto a substrate to irradiate a surface of the substrate.

In some embodiments of the present disclosure, the source gas and resulting GCIB may include at least one reactive substance for forming a chalcogenide material 201 on the substrate 152, as shown in FIG. 1. The source gas can include at least one chalcogen and at least one electropositive element. The at least one chalcogen and the at least one electropositive element may be selected such that the at least one chalcogen and the at least one electropositive element are in a gaseous state at room temperature and atmospheric pressure. For example, to form the chalcogenide material 201 of $GeS_2$ or other germanium sulfide material, the source gas may include a geranium compound, such as germane ($GeH_4$), and a sulfur compound, such as at least one of hydrogen sulfide ($H_2S$), and sulfur hexafluoride ($SF_6$). The germanium compound and the sulfur compound may be combined to simultaneously form the GCIB containing the germanium compound and the sulfur compound. Alternatively, the germanium compound and the sulfur compound may be introduced separately, but concurrently with each other to form a GCIB of the germanium compound and the sulfur compound. In an additional embodiment, the germanium and sulfur compounds may be introduced successively. For example, the source gas may contain a germanium compound which can be applied to a surface of the substrate. The germanium compound may then be replaced with a sulfur compound, which is subsequently applied to the surface of the substrate 152. The sulfur compound may then react with the germanium compound to form the chalcogenide material 201. Inert gases or dilution gases, such as helium (He) or argon (Ar), may also be included in the source gas to control the stoichiometry of the chalcogenide material 201.

Interaction of the accelerated ions with the surface of the substrate 152 can produce high temperatures, which drive the formation of the chalcogenide material 201 as well as reactions of the chalcogenide material 201 with the substrate 152. The contact between the accelerated ions and the substrate 152 may cause a localized increase in temperature of the substrate 152, leaving the remainder of the substrate 152 at substantially ambient temperature. For example, in some embodiments, the increased temperature may occur to a depth of less than about 20 nm from the surface of the substrate 152. In addition, the surface of the substrate 152 may cool rapidly after ion beam contact, and therefore return to ambient temperature in a short period of time. For example, the surface of the substrate 152 may cool in about ten picoseconds. By using the GCIB process to form the chalcogenide material 201, the bulk of the substrate 152 on which the chalcogenide material 201 is formed may remain at a low or room temperature, such as from about 10° C. to about 40° C. This enables additional device components, such as, for example, a logic device (not shown) to be formed on the substrate 152 prior to formation of the chalcogenide material 201.

By adjusting relative amounts of each of the at least one chalcogen and the at least one electropositive element, the chalcogenide material 201 may be formed with a desired stoichiometry. For example, the ratio of the germanium compound and the sulfur compound may be tailored so that the chalcogenide material 201 is $GeS_2$. However, by appropriately tailoring the ratio of the germanium compound to the sulfur compound, chalcogenide materials containing different ratios of germanium and sulfur may be formed including, but not limited to, germanium sulfide (GeS), $Ge_3S_7$, $Ge_4S_6$, or $Ge_2S_3$. The chalcogenide material containing germanium and sulfur may be referred to herein as a germanium sulfide material. Additionally, in conventional methods of forming a chalcogenide material, such as chemical vapor deposition (CVD), impurities, such as carbon, nitrogen, or silicon, may be present in the chalcogenide material. However, by utilizing the GCIB process, the chalcogenide material 201 may be substantially free of impurities and other defects. For example, the chalcogenide material 201 may have a purity of at least about ninety-eight percent (98%).

Figure 2:
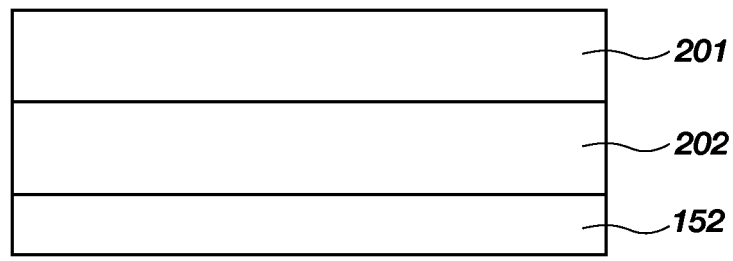
FIGS. 2 and 3 are cross-sectional views of a method of forming a metal-doped chalcogenide material.
Figure 3:
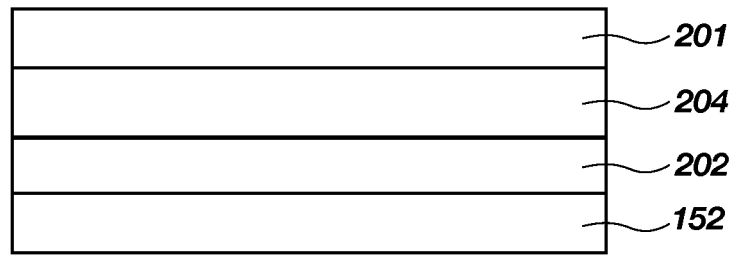

To dope the chalcogenide material 201, a metal material 202 may be formed in contact with the chalcogenide material 201 on the substrate 152. In some embodiments, the metal material 202 is formed on the substrate 152 and the chalcogenide material 201 is formed thereover. In other embodiments, the chalcogenide material 201 is formed on the substrate 152 and the metal material 202 is formed thereover. As shown in FIG. 2, the metal material 202 may be formed over a surface of the substrate 152. The metal material 202 may include a conductive material having a high solubility and high ion mobility in the chalcogenide material 201. For example, the metal material 202 may be formed of Ag or copper (Cu). The chalcogenide material 201 may be formed as described above over the metal material 202. As the chalcogenide material 201 is formed over the metal material 202, at least a portion of the chalcogenide material 201 may react with at least a portion of the metal material 202, forming a metal-doped chalcogenide material 204 as shown in FIG. 3. The metal-doped chalcogenide material 204 may form an active region and function as the switching element of an RRAM device, for example.

The metal in the metal-doped chalcogenide material 204 may be present as metal ions or as a metal chalcogenide. For instance, if the chalcogenide material 201 is formed with excess chalcogen ions, the metal in the metal-doped chalcogenide material 204 may be present as the metal chalcogenide, such as silver sulfide ($Ag_2S$). The metal ions or the metal chalcogenide may be phase separated in a matrix of the chalcogenide material 201. The metal-doped chalcogenide material 204 may be a homogeneous material including the metal material 202 and the chalcogenide material 201, or may include a gradient or other non-uniform distribution of the metal material 202 in the chalcogenide material 201. The metal in the metal-doped chalcogenide material 204 may be present at from about 2% to about 40% by volume of the metal-doped chalcogenide material 204. After forming the chalcogenide material 201 over the metal material 202, no additional processes may be required to form the metal-doped chalcogenide material 204. Instead, the energy (heat) generated by the GCIB process may be sufficient to react the chalcogenide material 201 and the metal material 202, enabling the metal-doped chalcogenide material 204 to be formed in situ.

Depending on the extent of the reaction, a portion of the metal material 202 and the chalcogenide material 201 may be reacted, producing the metal-doped chalcogenide material 204 shown in FIG. 3 in which a portion of the metal material 202 may remain between the substrate 152 and the metal-doped chalcogenide material 204 and a portion of the chalcogenide material 201 may overlie the metal-doped chalcogenide material 204. If, however, substantially all of the metal material 202 and the chalcogenide material 201 are reacted with one another, the material overlying the substrate 152 may be the metal-doped chalcogenide material 204. The portion of the metal material 202 that reacts with the portion of the chalcogenide material 201 may be controlled by adjusting the conditions of the GCIB process. For example, a higher acceleration of the gas clusters may result in the formation of a thicker, metal-doped chalcogenide material 204 and a decreased thickness of the metal material 202.

Figure 4:
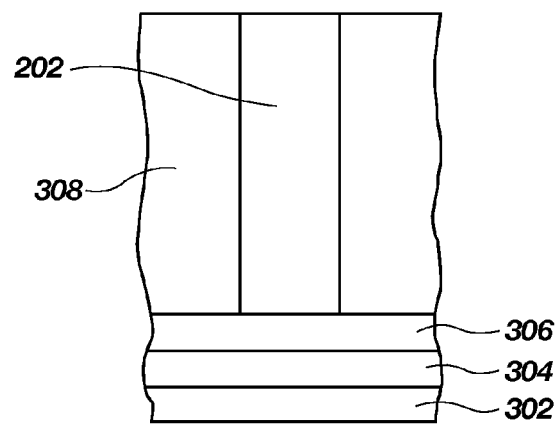
FIGS. 4-6 are cross-sectional views of one embodiment of a method of forming a RRAM memory cell including the metal-doped chalcogenide material of the present disclosure.
Figure 5:
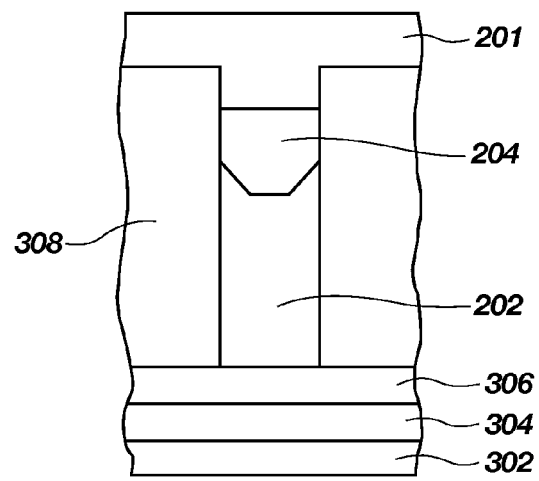
Figure 6:
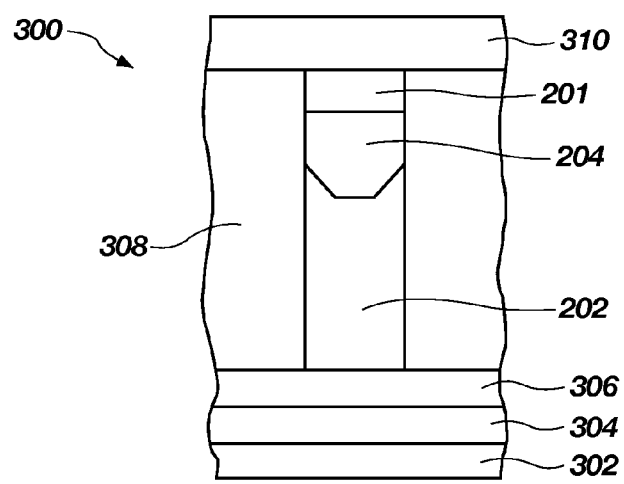

FIGS. 4-6 illustrate one embodiment of a RRAM memory cell 300 (FIG. 6) including the metal-doped chalcogenide material 204. As shown in FIG. 4, a first insulator material 304 may be formed over a semiconductor substrate 302. The substrate 302 may be a conventional silicon substrate or other bulk substrate including a layer of semiconductor material. As used herein, the term "bulk substrate" includes not only silicon wafers, but also silicon-on-insulator (SOI) substrates, silicon-on-sapphire (SOS) substrates, epitaxial layers of silicon on a base semiconductor foundation, and other semiconductor or optoelectronics materials, such as silicon-germanium, germanium, gallium arsenide, or indium phosphide. The material of the substrate 302 may be doped or undoped. The first insulator material 304 may be an insulative material known in the art, such as silicon oxide, silicon nitride, silicon oxynitride, a spin-on glass (SOG), a phosphosilicate glass (PSG), tetraethyl orthosilicate (TEOS), or borophosilicate glass (BPSG). The first insulator material 304 may be formed by conventional techniques, such as by plasma enhanced CVD (PECVD) or standard thermal CVD. A first electrode 306 may be formed over the first insulator material 304. The first electrode 306 may be formed of any suitable conductive material including, but not limited to, a metal, a metal alloy, a conductive metal oxide, or combinations thereof. For example, the first electrode 306 may be formed of tungsten (W), nickel (Ni), tantalum nitride (TaN), platinum (Pt), tungsten nitride (WN), gold (Au), titanium nitride (TiN), or titanium aluminum nitride (TiAlN).

A second insulator material 308 may be formed over the first electrode 306. The second insulator material 308 may be, for example, a silicon oxide, a silicon nitride, BPSG, borosilicate glass (BSG), PSG, or TEOS. The second insulator material 308 may be patterned, as known in the art, to form an opening (not shown) and expose a portion of the first electrode 306. The opening in the second insulator material 308 may then be filled with the metal material 202. The metal material 202 may have a thickness of between about one nanometer (1 nm) and 50 nanometers (50 nm). The metal material 202 may be formed in electrical communication with the first electrode 306. In one embodiment, the metal material 202 is Ag and forms an Ag damascene plug.

As shown in FIG. 5, the chalcogenide material 201 may be formed over the second insulator material 308 and the metal material 202 using the GCIB process as previously described. The metal-doped chalcogenide material 204 may be formed in situ between the chalcogenide material 201 and the metal material 202 as a result of the energy generated by the GCIB process. As previously discussed, the desired thickness of the metal-doped chalcogenide material 204 may be obtained by adjusting the operating conditions of the GCIB processor. The metal-doped chalcogenide material 204 may form an active region in the metal material 202, such as an Ag-doped $GeS_2$ active region in the Ag damascene plug.

As shown in FIG. 6, a second electrode 310 may be formed over the chalcogenide material 201 to form the RRAM memory cell 300. In some embodiments, the chalcogenide material 201 may be planarized down to, or near, a planar surface of the second insulator material 308 before forming the second electrode 310. The chalcogenide material 201 may also be patterned and self aligned with the second electrode 310. The second electrode 310 may be formed of any suitable conductive material including, but not limited to, a metal, a metal alloy, a conductive metal oxide, or combinations thereof. For example, the first electrode 310 may be formed of tungsten (W), nickel (Ni), tantalum nitride (TaN), platinum (Pt), tungsten nitride (WN), gold (Au), titanium nitride (TiN), or titanium aluminum nitride (TiAlN).

Figure 7:
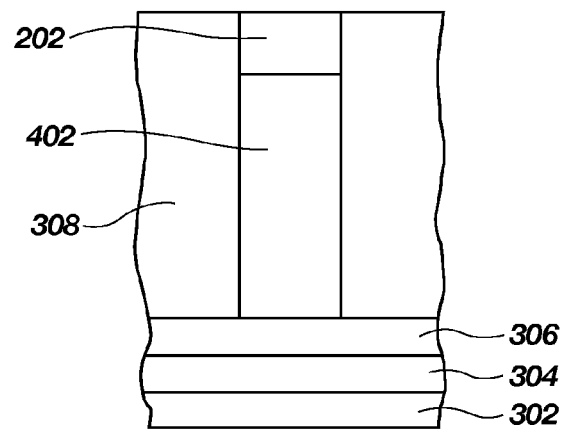
FIGS. 7-9 are cross-sectional views of another embodiment of a method of forming a RRAM memory cell including the metal-doped chalcogenide material of the present disclosure.
Figure 8:
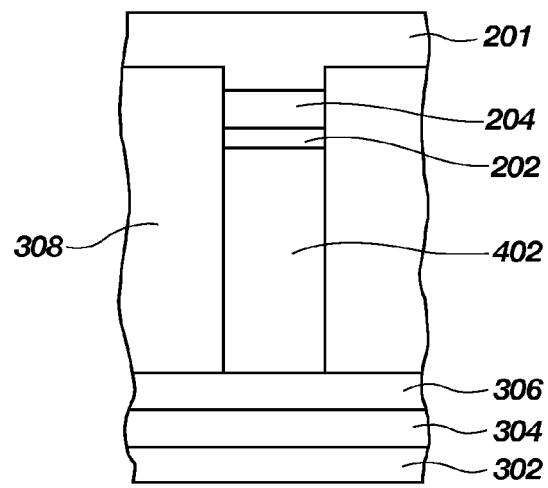
Figure 9:
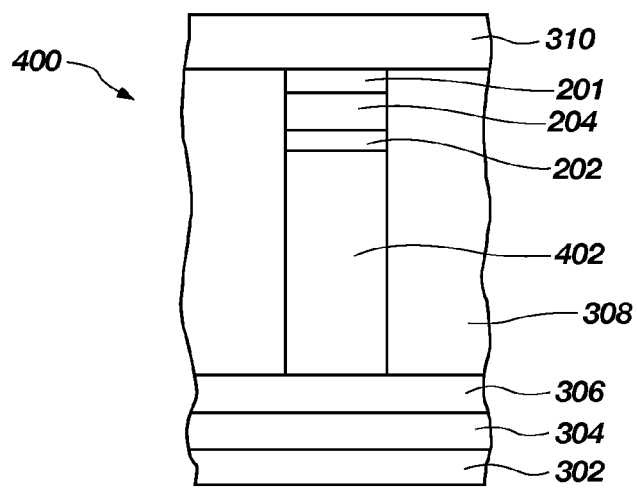

FIGS. 7-9 illustrate another embodiment of a RRAM memory cell 400 (FIG. 9) including the metal-doped chalcogenide material 204. As shown in FIG. 7, the second insulator material 308 may be formed over the first electrode 306, the first insulator material 304, and the substrate 302. The second insulator material 308 may be patterned, as known in the art, to form an opening (not shown) therein and expose a portion of the first electrode 306. The opening may be partially filled with a conductive material to form a conductive plug 402. The conductive plug 402 may be formed of any suitable conductive material including, but not limited to, Cu, W, Ni, TaN, Pt, WN, Au, TiN, or TiAlN. In some embodiments, the conductive plug 402 may be formed of the same material as the first electrode 306. The metal material 202 may then be formed over the conductive plug 402 within the opening in the second insulator material 308. The first electrode 306 and the metal material 202 may be recessed in the opening in the second insulator material 308.

As shown in FIG. 8, the chalcogenide material 201 may be formed over the second insulator material 308 and the metal material 202 using the GCIB process as previously described. The metal-doped chalcogenide material 204 may be formed in situ between the chalcogenide material 201 and the metal material 202 as a result of the energy generated by the GCIB process. As previously discussed, the desired depth of the metal-doped chalcogenide material 204 in the metal material 202 may be obtained by adjusting the operating conditions of the GCIB processor. In some embodiments (not shown), the entire metal material 202 over the conductive plug 402 may form the metal-doped chalcogenide material 204. In other embodiments, a portion of the metal material 202 is unconverted. As shown in FIG. 9, the second electrode 310 may be formed over the chalcogenide material 201 to form the RRAM memory cell 400. In some embodiments, the chalcogenide material 201 may be planarized to or near a planar surface of the second insulator material 308 before forming the second electrode 310. The metal-doped chalcogenide material 204 may form an active region at the top of the conductive plug 402, such as an Ag-doped GeS$_2$ active region in the Ag plug.

Figure 10:
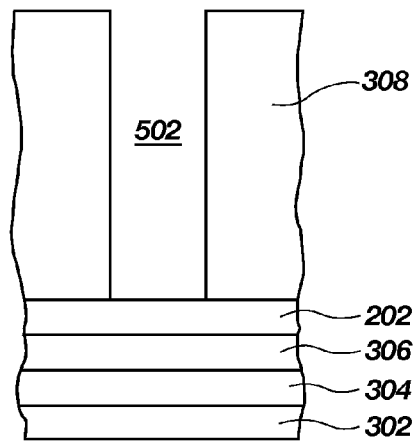
FIGS. 10-12 are cross-sectional views of yet another embodiment of a method of forming a RRAM memory cell including the metal-doped chalcogenide material of the present disclosure.
Figure 11:
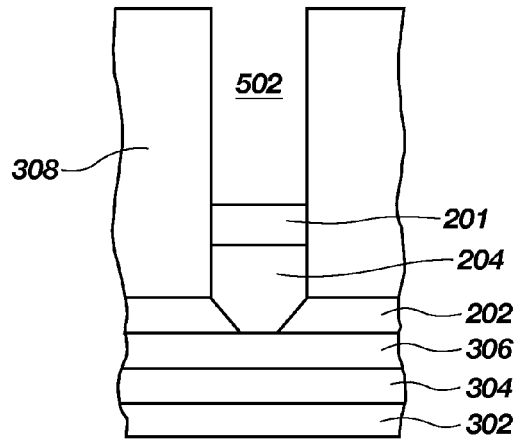
Figure 12:
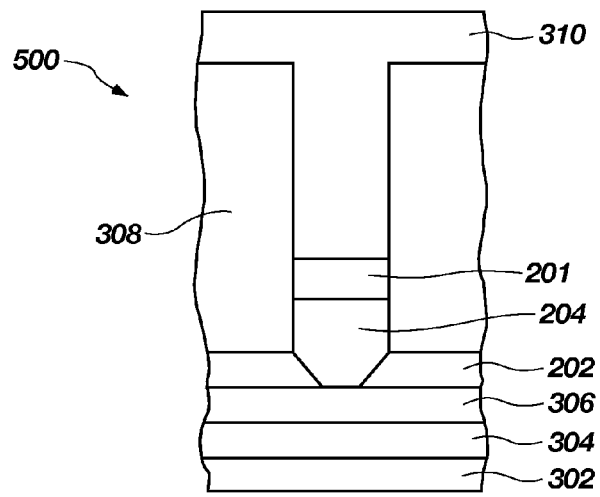

FIGS. 10-12 illustrate another embodiment of a RRAM memory cell 500 (FIG. 12) including the metal-doped chalcogenide material 204. As shown in FIG. 11, the metal material 202 may be formed over the first electrode 306, the first insulator material 304, and the substrate 302. The metal material 202 may function as a cap over the first electrode 306. The second insulator material 308 may then be formed over the metal material 202 and patterned, as known in the art, to form a trench 502 therein and expose a portion of the metal material 202.

As shown in FIG. 11, the chalcogenide material 201 may be formed in the trench 502, over the metal material 202, using the GCIB process as previously described. The chalcogenide material 201 may partially fill the trench 502. During the GCIB process, the metal material 202 exposed in the trench 502 may be reacted with the chalcogenide material 201 to form the metal-doped chalcogenide material 204 (FIG. 11). As previously discussed, the desired depth of the metal-doped chalcogenide material 204 in the metal material 202 may be obtained by adjusting the operating conditions of the GCIB processor. In some embodiments, the entire thickness of the metal material 202 exposed through the trench 502 may form the metal-doped chalcogenide material 204. In other embodiments, the entire thickness of the chalcogenide material 201 formed in the trench 502 may form the metal-doped chalcogenide material 204. As shown in FIG. 12, the second electrode 310 may be formed over the chalcogenide material 201 within the trench 502 to form the RRAM memory cell 500. As shown in FIG. 12, the metal-doped chalcogenide material 204 may form an active region at the bottom of the trench 502, such as an Ag-doped GeS$_2$ active region at the bottom of the trench 502. However, depending on the extent of the reaction between the metal material 202 and the chalcogenide material 201, the active region may be in contact with both the first electrode 306 and the second electrode 310.

Figure 13:
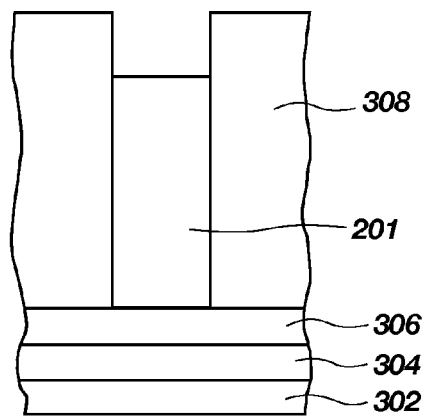
FIGS. 13-15 are cross-sectional views of still yet another embodiment of a method of forming a RRAM memory cell including the metal-doped chalcogenide material of the present disclosure.
Figure 14:
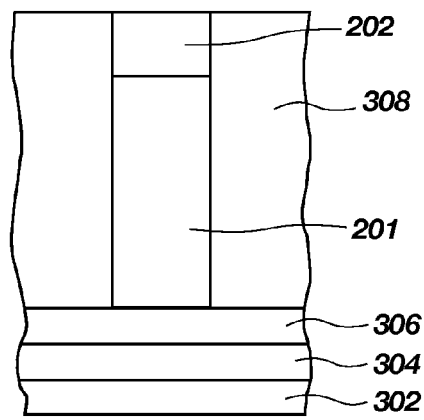
Figure 15:
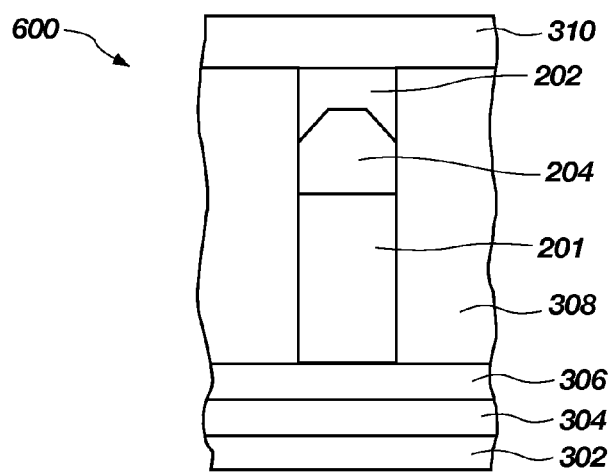

FIGS. 13-15 illustrate another embodiment of a RRAM memory cell 600 (FIG. 15) including the metal-doped chalcogenide material 204. As shown in FIG. 14, the second insulator material 308 may be formed over the first electrode 306, the first insulator material 304, and the substrate 302. The second insulator material 308 may be patterned, as known in the art, to form an opening (not shown) therein and expose a portion of the first electrode 306. The opening in the second insulator material 308 may then be partially filled with the chalcogenide material 201 using the GCIB process as previously described.

As shown in FIG. 14, the metal material 202 may be formed over the chalcogenide material 201, filling the remainder of the opening. Any metal material 202 overlying the exposed horizontal surface of the first insulator material 304 may be planarized, such as by chemical-mechanical planarization (CMP). The second electrode 310 may then be formed over the metal material 202 and the second insulator material 308, as shown in FIG. 15, to form the RRAM memory cell 600. The metal material 202 and the chalcogenide material 201 may be reacted to form the metal-doped chalcogenide material 204 during formation of the second electrode 310 or during a subsequent anneal of the RRAM memory cell 600. The metal-doped chalcogenide material 204 may form an active region over the first electrode 306, such as an Ag-doped GeS$_2$ active region over the first electrode 306. Depending on the extent of the reaction between the metal material 202 and the chalcogenide material 201, the active region may be in contact with both the bottom electrode and a remaining portion of the metal material 202, or may be positioned between a remaining portion of the chalcogenide material 201 and a remaining portion of the metal material 202, as shown in FIG. 15.

Figure 16:
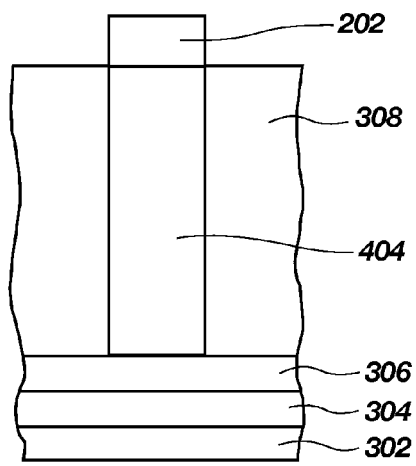
FIGS. 16-18 are cross-sectional views of another embodiment of a method of forming a RRAM memory cell including the metal-doped chalcogenide material of the present disclosure.
Figure 17:
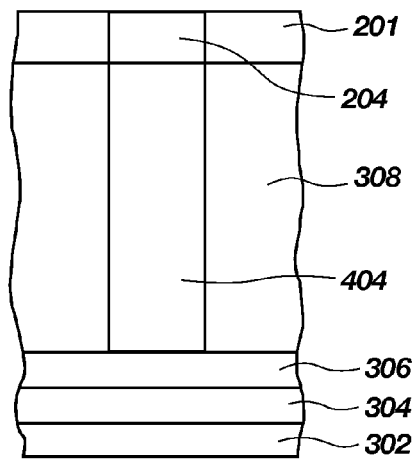
Figure 18:
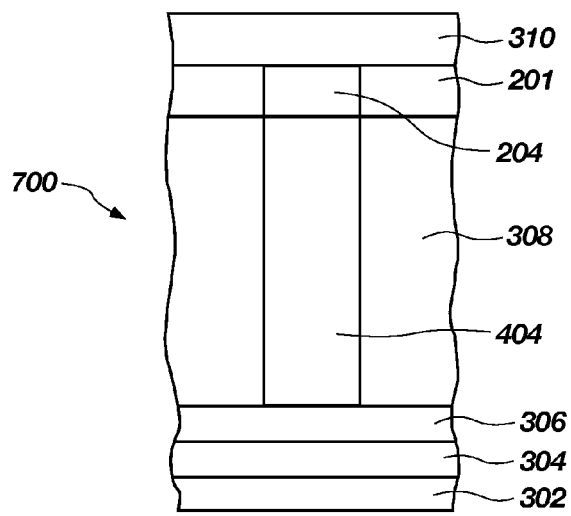

FIGS. 16-18 illustrate another embodiment of a RRAM memory cell 700 (FIG. 18) including the metal-doped chalcogenide material 204. As shown in FIG. 16, the second insulator material 308 may be formed over the first electrode 306, the first insulator material 304, and the substrate 302. The second insulator material 308 may be patterned, as known in the art, to form an opening (not shown) therein and expose a portion of the first electrode 306. The opening of the second insulator material 308 may be partially filled with a conductive material to form a contact 404. The contact 404 may be formed of any suitable conductive material including, but not limited to, Cu, W, Ni, TaN, Pt, WN, Au, TiN, or TiAlN. In some embodiments, the contact 404 may be formed of the same material as the first electrode 306. The contact 404 may be planarized to or near a surface of the second insulator material 308. The metal material 202 may be formed over the contact 404. The metal material 202 may extend above a surface of the second insulator material 308. The metal material 202 may be selectively formed over the contact 404, or a layer of the metal may be formed over the contact 404 and the second insulator material 308 and patterned, producing the metal material 202.

As shown in FIG. 17, the chalcogenide material 201 may be formed over the second insulator material 308 and the metal material 202 using the GCIB process as previously described. The metal material 202 may react with the chalcogenide material 201 to form the metal-doped chalcogenide material 204. As shown in FIG. 18, the second electrode 310 may be formed over the chalcogenide material 201 and the metal-doped chalcogenide material 204 to form the RRAM memory cell 700. As shown in FIG. 18, the metal-doped chalcogenide material 204 may form an active region above the contact 404, such as an Ag-doped GeS$_2$ active region over the contact 404. However, depending on the extent of the reaction between the metal material 202 and the chalcogenide material 201, the active region may extend further into the chalcogenide material 201.

In the RRAM memory cells 300, 400, 500, 600 described herein, the chalcogenide material 201 may be formed in a trench or opening formed in the second insulation material 308. When forming a chalcogenide material in a trench or opening using conventional methods, such as PVD, evaporation, or high temperature CVD, the chalcogenide material may accumulate on a top or a side of the trench faster than a bottom of the trench, resulting in the formation of voids or so-called "key holes" in the chalcogenide material. The ability to form the chalcogenide material in trenches or openings is especially problematic as device sizes continue to shrink. However, by forming the chalcogenide material 201 using the GCIB process as described herein, the chalcogenide material 201 may be formed within a trench or opening in the second insulation material 308 without forming voids or so-called "key holes." For example, the GCIB process as described herein may be used to form the chalcogenide material 201 in a trench having a cross-section dimension less than about forty nanometers (40 nm). In addition, the chalcogenide material 201 and metal-doped chalcogenide material 204 in the RRAM memory cells 300, 400, 500, 600, 700 may have improved adhesion to at least one of the first electrode 306, the second electrode 310, and the second insulator material 308 than a chalcogenide material or metal-doped chalcogenide material formed using conventional techniques. In addition, while the previous embodiments describe the metal-doped chalcogenide material 204 in RRAM memory cells, it is understood that the metal-doped chalcogenide material 204 may also be used in additional devices, such as a diode or switch.

Figure 19:
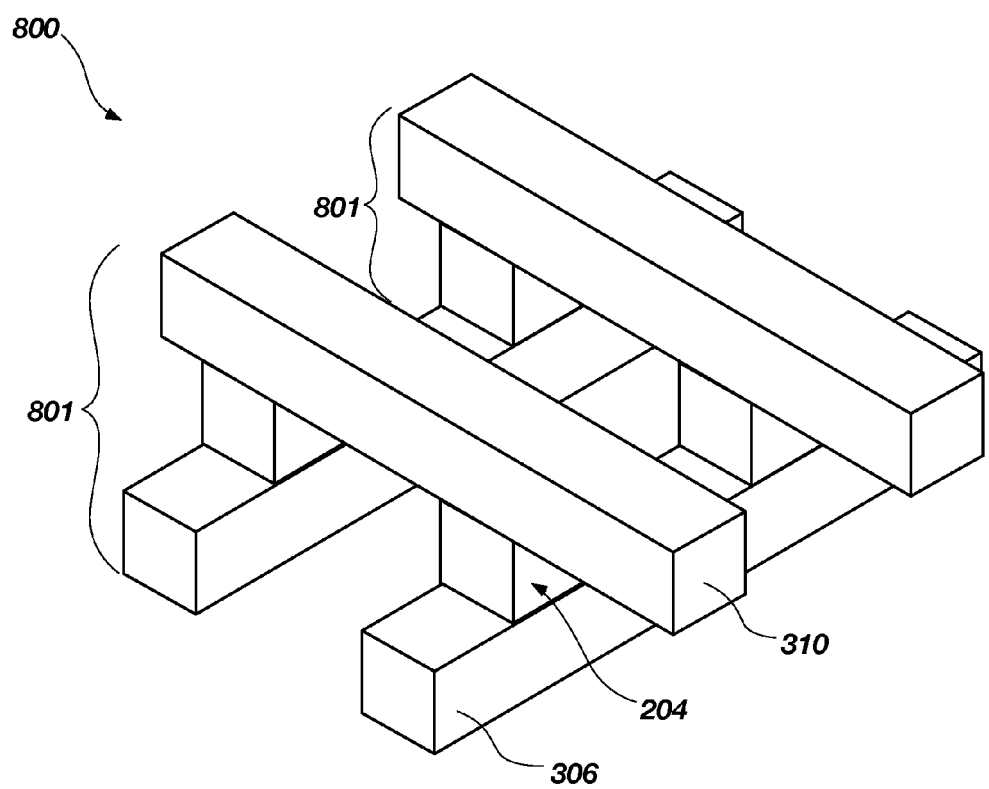
FIG. 19 is a perspective view of an RRAM array including a plurality of RRAM memory cells of the present disclosure.

FIG. 19 illustrates an embodiment of an RRAM array 800 including at least one RRAM memory cell 801. The RRAM memory cell 801 may be one of the RRAM memory cells 300, 400, 500, 600, 700 previously described. The RRAM array 800 includes the first electrode 306, the second electrode 310, and the metal-doped chalcogenide material 204 therebetween. While not shown in FIG. 19, the RRAM array 800 may also include portions of the metal material 202 and chalcogenide material 201, as previously described in relation to FIGS. 7-18, depending on the RRAM memory cell 300, 400, 500, 600, 700 formed. The first electrode 306 may include at least one linear element extending lengthwise in a first direction. The second electrode 310 may include at least one linear element extending lengthwise in a second direction that is at least substantially perpendicular to the first direction.

The metal-doped chalcogenide material 204 may be interposed between the first electrode 306 and the second electrode 310. Thus, the RRAM memory cells 801 are disposed in an array, e.g., a 2×2 array as shown in FIG. 19.

As shown in FIG. 19, a plurality of RRAM memory cells 801 may be formed to produce the RRAM array 800. The first electrode 306 may serve as at least one data line (e.g., digit line, such as a bit line). The second electrode 310 may serve as at least one access line (e.g., word line). A voltage applied to the data and access lines is controlled such that an electric field is applied to only a selected at least one data line and a selected at least one access line, whereby the RRAM memory cells 801 may be selectively operated. Accordingly, a memory device may be formed with an RRAM array 800.

Figure 20:
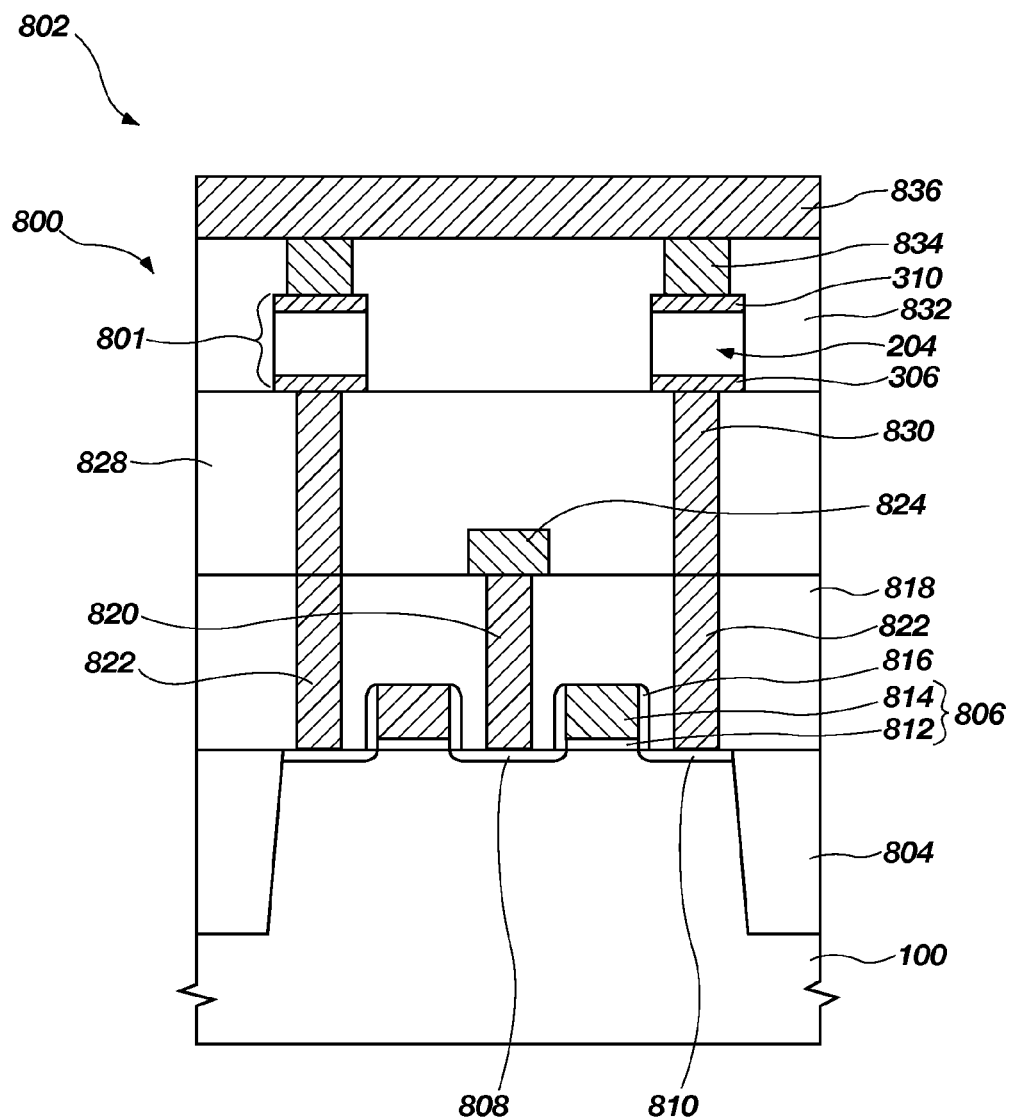
FIG. 20 is a cross-sectional view of an RRAM device including a RRAM memory cell of the present disclosure.

FIG. 20 illustrates an embodiment of an RRAM device 802 including an RRAM array 800 of RRAM memory cells 801. The RRAM device 802 may include the RRAM array 800 and switching devices, such as a MOS transistor. The RRAM device 802 may include a semiconductor substrate 100 having an isolation region 804. A MOS transistor may be formed in an active region of the semiconductor substrate 100. Each MOS transistor may include a gate structure 806 and source regions 808 and drain regions 810. The gate structure 806 may include a gate insulation layer 812 and a gate electrode 814. The source region 808 and the drain region 810 may be formed on the substrate 100 adjacent to the gate structure 806. A spacer 816 may be formed on each sidewall of the gate structure 806.

A first insulating material 818 may be formed on the substrate 100 over the gate structures 806 and the source regions 808 and the drain regions 810. A first contact plug 820, extending through the first insulating material 818 may be electrically connected to each source region 808. A second contact plug 822, extending through the first insulating material 818, may be electrically connected to each drain region 810. At least one data line 824 may be formed over the first contact plug 820. A second insulating material 828 may be formed over the first insulating material 818 and the data line 824 and the second contact plugs 822. A third contact plug 830, extending through the second insulating material 828, may be electrically connected to each of the second contact plugs 822.

The RRAM memory cell 801 may be formed on each third contact plug 830. The RRAM memory cell 801 may be one of the RRAM memory cells 300, 400, 500, 600, 700 previously described. Each RRAM memory cell 801 may include the first electrode 306, the metal-doped chalcogenide material 204, and the second electrode 310. A third insulating material 832, which may substantially correspond to the second insulator material 308 described above regarding FIGS. 4-18 may be formed over each of the RRAM memory cells 801. A fourth contact plug 834, extending through the third insulating material 832 may be electrically connected to the second electrode 310. An access line 836 may be formed over the fourth contact plug 834. Alternatively, in some embodiments, the fourth contact plug 834 and the access line 836 may be omitted and the second electrode 310 may be extended across more than one RRAM memory cell 801.

CONCLUSION

In some embodiments, the present disclosure includes a method of forming a chalcogenide material on a surface of a substrate. The method includes exposing a surface of a substrate to ionized gas clusters from a source gas, the ionized gas clusters comprising at least one chalcogen and at least one electropositive element.

In additional embodiments, the present disclosure includes a method of forming a resistive random access memory device. The method includes forming a plurality of memory cells, wherein forming each memory cell of the plurality of memory cells comprises forming a metal on a first electrode, forming a chalcogenide material on the metal by a gas cluster ion beam process, and forming a second electrode on the chalcogenide material.

In further embodiments, the present disclosure includes a method of forming a resistive random access memory device. The method includes forming a plurality of resistive random access memory cells, wherein forming each resistive random access memory cell of the plurality of resistive random access memory cells comprises forming silver on a first electrode, forming a gas cluster ion beam comprising germanium and sulfur, exposing the silver to the gas cluster ion beam to form a germanium sulfide material on the silver, and forming a second electrode on the germanium sulfide material.

In additional embodiments, the present disclosure includes a resistive random access memory device comprising a plurality of memory cells, each memory cell of the plurality of memory cells comprising a first electrode, a silver-doped germanium sulfide material, and a second electrode. The silver-doped germanium sulfide material is greater than about 98% pure.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention encompasses all modifications, variations and alternatives falling within the scope of the invention as defined by the following appended claims and their legal equivalents.

What is claimed is:

1. A method, comprising:
   forming a first gas cluster ion beam from a first source gas comprising at least one germanium compound;
   exposing a substrate to the first gas cluster ion beam to form a germanium material on the substrate;
   forming a second gas cluster ion beam from a second source gas comprising at least one sulfur compound; and
   exposing the germanium material to the second gas cluster ion beam to convert the germanium material into a chalcogenide material comprising germanium and sulfur.

2. The method of claim 1, further comprising forming a metal material over the chalcogenide material.

3. The method of claim 2, wherein forming the metal material over the chalcogenide material comprises forming at least one of silver and copper over the chalcogenide material.

4. The method of claim 2, wherein forming the metal material over the chalcogenide material comprises contacting the chalcogenide material with the metal material to dope the chalcogenide material with metal.

5. The method of claim 4, wherein contacting the chalcogenide material with the metal material to dope the chalcogenide material with metal comprises reacting silver of the metal material with germanium and sulfur of the chalcogenide material to dope the chalcogenide material with the silver.

6. The method of claim 1, wherein forming a first gas cluster ion beam from a first source gas comprising at least one germanium compound comprises forming the first source gas to comprise germane, and wherein forming a second gas cluster ion beam from a second source gas comprising at least one sulfur compound comprises forming the second source gas to comprise hydrogen sulfide.

7. The method of claim 1, wherein exposing the germanium material to the second gas cluster ion beam to convert the germanium material into a chalcogenide material comprising germanium and sulfur comprises forming the chalcogenide material to consist essentially of germanium and sulfur.

8. A method of forming a chalcogenide material on a surface of a substrate, comprising exposing the surface of the substrate to ionized gas clusters comprising germane and hydrogen sulfide.

9. A method of forming a chalcogenide material, comprising:
forming a metal material; and
exposing the metal material to ionized gas clusters formed from a source gas comprising germane and hydrogen sulfide to form the chalcogenide material over an exposed surface of the metal material and to form a metal-doped chalcogenide material between the metal material and the chalcogenide material.

10. The method of claim 9, wherein exposing the metal material to ionized gas clusters framed from a source gas comprising germane and hydrogen sulfide to form the chalcogenide material over an exposed surface of the metal material and to form the metal-doped chalcogenide material between the metal material and the chalcogenide material comprises forming the metal-doped chalcogenide material to have a metal content within a range of from about 2% by volume to about 40% by volume.

11. A method of forming a resistive random access memory device, comprising:
forming a plurality of memory cells, wherein forming each memory cell of the plurality of memory cells comprises:
forming a metal on a first electrode;
exposing the metal to ionized gas clusters formed from a source gas comprising germane and hydrogen sulfide to form a chalcogenide material on the metal; and
forming a second electrode on the chalcogenide material.

12. The method of claim 11, wherein exposing the metal to ionized gas clusters formed from a source gas comprising germane and hydrogen sulfide to form a chalcogenide material on the metal comprises:
forming the chalcogenide material on the metal using the ionized gas clusters; and
reacting the chalcogenide material with the metal using energy generated from the ionized gas clusters to form a metal-doped chalcogenide material between the metal and the chalcogenide material.

13. The method of claim 11, wherein forming the metal on the first electrode comprises forming at least one of silver and copper on the first electrode.

14. The method of claim 13, further comprising forming a conductive contact between the first electrode and the metal.

15. The method of claim 11, wherein exposing the metal to ionized gas clusters formed from a source gas comprising germane and hydrogen sulfide to form a chalcogenide material on the metal comprises forming the chalcogenide material at a temperature of from about 10° C. to about 40° C.

16. The method of claim 11, wherein exposing the metal to ionized gas clusters formed from a source gas comprising germane and hydrogen sulfide to form the chalcogenide material on the metal comprises forming the chalcogenide material to have a greater amount of sulfur than germanium.

17. A method of forming a resistive random access memory device, comprising:
forming resistive random access memory cells, wherein forming each of the resistive random access memory cells comprises:
forming a metal on a first electrode;
forming a gas cluster ion beam comprising germanium and sulfur;
exposing the metal to the gas cluster ion beam to form a chalcogenide material consisting essentially of germanium and sulfur on an exposed surface of the metal; and
forming a second electrode on the chalcogenide material.

18. The method of claim 17, further comprising reacting the metal and the chalcogenide material to form a metal-doped chalcogenide material.

19. The method of claim 17, wherein forming the metal on the first electrode compromises forming silver on the first electrode.

20. The method of claim 17, wherein exposing the metal to the gas cluster ion beam to form the chalcogenide material on an exposed surface of the metal comprises forming $GeS_2$, $Ge_3S_7$, $Ge_4S_6$, or $Ge_2S_3$ on the exposed surface of the metal.

21. The method of claim 17, wherein exposing the metal to the gas cluster ion beam to form a chalcogenide material consisting essentially of germanium and sulfur comprises forming the chalcogenide material to consist of germanium and sulfur.

22. The method of claim 17, wherein forming a gas cluster ion beam comprising germanium and sulfur comprises forming the gas cluster ion beam from a source gas comprising germane and hydrogen sulfide.

* * * * *

UNITED STATES PATENT AND TRADEMARK OFFICE
CERTIFICATE OF CORRECTION

PATENT NO.         : 8,679,914 B2              Page 1 of 1
APPLICATION NO.    : 12/917930
DATED              : March 25, 2014
INVENTOR(S)        : Timothy A. Quick It is certified that error appears in the above-identified patent and that said Letters Patent is hereby corrected as shown below:

In the Claims

In column 11, line 42, in claim 10, delete "framed" and insert -- formed --, therefor.

Signed and Sealed this
Twenty-ninth Day of July, 2014

Michelle K. Lee
*Deputy Director of the United States Patent and Trademark Office*